United States Patent
Chaudhari et al.

(10) Patent No.: US 12,387,923 B2
(45) Date of Patent: Aug. 12, 2025

(54) ANALYZING METHOD

(71) Applicant: TAIWAN SEMICONDUCTOR MANUFACTURING COMPANY LTD., Hsinchu (TW)

(72) Inventors: Pradip Girdhar Chaudhari, Hsinchu (TW); Che-Hui Lee, Taipei (TW); Wen-Cheng Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 419 days.

(21) Appl. No.: 17/814,551

(22) Filed: Jul. 25, 2022

(65) Prior Publication Data
US 2022/0359175 A1 Nov. 10, 2022

Related U.S. Application Data

(62) Division of application No. 16/430,179, filed on Jun. 3, 2019, now Pat. No. 11,532,470.

(60) Provisional application No. 62/771,835, filed on Nov. 27, 2018.

(51) Int. Cl.
G01B 7/00 (2006.01)
G01B 7/004 (2006.01)
G01D 5/14 (2006.01)
H01J 37/34 (2006.01)

(52) U.S. Cl.
CPC .......... H01J 37/3476 (2013.01); G01B 7/003 (2013.01); G01B 7/004 (2013.01); G01D 5/145 (2013.01); H01J 37/3435 (2013.01)

(58) Field of Classification Search
CPC .............. H01J 37/3476; H01J 37/3435; H01L 21/67253; H01L 22/12; G01B 7/003; G01B 7/004; G01D 5/145
USPC ......................... 204/298.12, 298.03, 192.13
See application file for complete search history.

(56) References Cited

U.S. PATENT DOCUMENTS

2006/0021870 A1* 2/2006 Tsai ................... C23C 14/3414
204/192.12

FOREIGN PATENT DOCUMENTS

JP 2008-133520 * 6/2008

OTHER PUBLICATIONS

Machine Translation JP 2008-133520 (Year: 2008).*

* cited by examiner

*Primary Examiner* — Rodney G McDonald
(74) *Attorney, Agent, or Firm* — WPAT LAW; Anthony King

(57) ABSTRACT

A method includes providing a jig including a predetermined center and a magnetron installed on the jig; rotating the magnetron and obtaining a measured first magnetic flux density at the predetermined center of the jig; defining a first area of the magnetron based on the measured first magnetic flux density; rotating the magnetron and measuring a plurality of second magnetic flux densities within the first area of the magnetron; deriving a measured second magnetic flux density among the plurality of second magnetic flux densities; comparing the measured second magnetic flux density with a predetermined threshold; and performing an operation based on the comparison.

20 Claims, 5 Drawing Sheets

ANALYZING METHOD

PRIORITY CLAIM AND CROSS-REFERENCE

This application is a divisional application of the U.S. non-provisional application Ser. No. 16/430,179 filed on Jun. 3, 2019, entitled "ANALYZING METHOD," and claimed the benefit of provisional application Ser. 62/771,835 filed on Nov. 27, 2018, entitled "A METHOD OF ANALYZING A MANUFACTURING APPARATUS," the disclosure of which is hereby incorporated by reference in its entirety.

BACKGROUND

With the advancement of electronic technology, semiconductor device is becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

Prior to fabrication of the semiconductor device, calibration of a manufacturing apparatus is performed. Components of the manufacturing apparatus have to undergo tuning or adjustment for the purpose of fabrication stability and repeatability. The manufacturing operations can be repeatedly implemented on each of the semiconductor devices, and semiconductor components can be accurately assembled on the semiconductor device. However, the calibration of the manufacturing apparatus is dependent on accuracy of data associated with physical properties of each component of the manufacturing apparatus (i.e. dimension, coefficient of thermal expansion, life span, hardness, etc.). As such, stability of the manufacturing apparatus and manufacturing repeatability of the semiconductor device may encounter challenges.

Therefore, there is a continuous need to modify and improve the fabrication of the semiconductor device and the manufacturing apparatus for fabricating the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
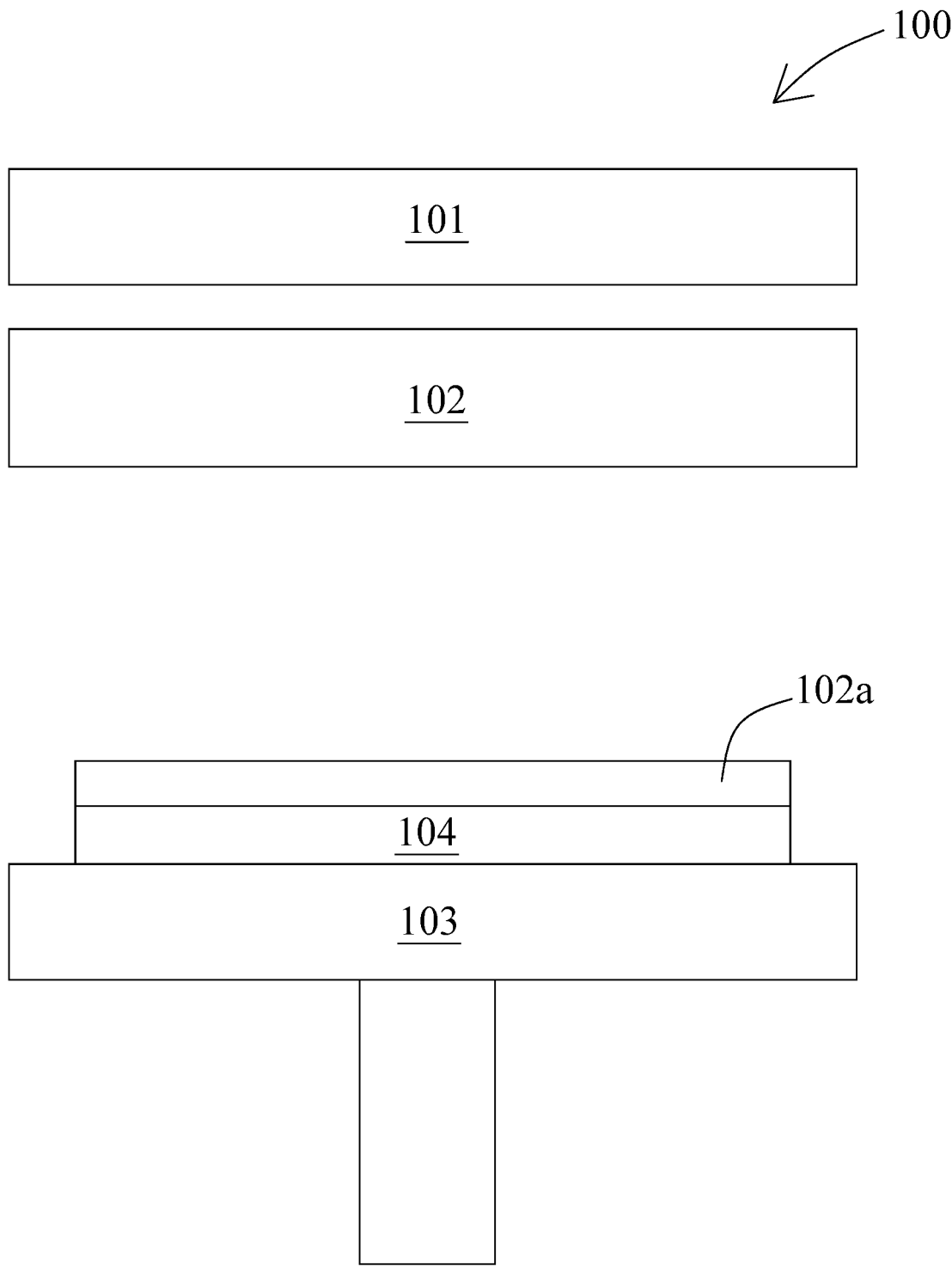
FIG. 1 is a schematic cross sectional view of a manufacturing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. The operations are performed by manufacturing apparatuses. Calibration of the manufacturing apparatus is performed before the performance of the operations. The calibration is performed based on the data associated with physical properties of each component of the manufacturing apparatus (i.e. dimension, coefficient of thermal expansion, life span, hardness, etc.). However, measurement of those physical properties may not be accurate. Those data may have some deviations. For example, profiles of a magnetron and a sputtering target in a sputter may not be accurately derived, and thus sputtering over the semiconductor structure may not be implemented repeatedly and stably.

In the present disclosure, a method of analyzing a manufacturing apparatus is disclosed. The method includes providing a jig including a predetermined center and a magnetron installed on the jig; rotating the magnetron and obtaining a measured first magnetic flux density at the predetermined center of the jig; defining a first area of the magnetron based on the measured first magnetic flux density; rotating the magnetron and measuring a plurality of second magnetic flux densities within the first area of the magnetron; deriving a measured second magnetic flux density among the plurality of second magnetic flux densities; comparing the measured second magnetic flux density with a predetermined threshold, and performing an operation based on the comparison. A position of a center of the magnetron used in a sputter can be accurately obtained based on the method.

In the present disclosure, another method of analyzing a manufacturing apparatus is disclosed. The method includes providing a jig including a predetermined center and a sputtering target installed on the jig; defining a first area of the jig around the predetermined center, measuring a plurality of first depths within the first area of the jig; deriving a maximum first depth among the plurality of first depths; defining a second area of the jig around the maximum first depth of the jig; measuring a plurality of second depths within the second area of the jig; deriving a maximum second depth among the plurality of second depths; comparing the maximum first depth with the maximum second depth; and performing an operation based on the comparison. A position of a center of the sputtering target used in a sputter can be accurately obtained based on the method.

Therefore, repeatability and stability of manufacturing of the semiconductor structure by the sputter can be improved. A reliability of the semiconductor structure can also be improved.

FIG. 1 is a schematic view of an apparatus 100 in accordance with various embodiments of the present disclosure. In some embodiments, the apparatus 100 includes a magnetron 101, a sputtering target 102, a stage 103 and a substrate 104. In some embodiments, the apparatus 100 is configured to perform sputtering operations. In some embodiments, the apparatus 100 is configured to perform physical vapor deposition (PVD) operations. In some embodiments, the apparatus 100 is configured to perform deposition of a coating 102a over the substrate 104. In some embodiments, the apparatus 100 is a sputter.

In some embodiments, the magnetron 101 is provided over the sputtering target 102. In some embodiments, the magnetron 101 is disposed on the sputtering target 102. In some embodiments, the magnetron 101 is arranged in a close proximity to the sputtering target 102. In some embodiments, the magnetron 101 is physically contacted with the sputtering target 102 or spaced from the sputtering target 102. In some embodiments, the magnetron 101 is configured to provide a magnetic field. In some embodiments, the magnetron 101 is configured to provide a magnetic field around the sputtering target 102.

In some embodiments, the magnetron 101 is a permanent magnet or rotatable magnet. In some embodiments, the magnetron 101 is rotatable about its center. In some embodiments, the magnetron 101 is electrically connected to a voltage. In some embodiments, the magnetron 101 is in circular, elliptical, annular, spiral, irregular or any other suitable shapes.

In some embodiments, the sputtering target 102 is disposed adjacent to the magnetron 101. In some embodiments, at least a portion of the sputtering target 102 is consumed upon the sputtering operations. In some embodiments, an atom of the sputtering target 102 is knocked out by an energized ion upon the sputtering operations. In some embodiments, the sputtering target 102 is a piece of material from which the coating 102a over the substrate 104 is to be formed.

In some embodiments, the sputtering target 102 includes conductive or insulating material. In some embodiments, the sputtering target 102 includes a precursor material which can react with a gas to form a molecule from which the coating 102a deposited over the substrate 104 is made. In some embodiments, the sputtering target 102 includes copper, copper oxide, silicon, aluminum, manganese, aluminum nitride, aluminum oxide, etc. In some embodiments, the sputtering target 102 is electrically connected to a cathode. In some embodiments, the sputtering target 102 is in a circular shape.

In some embodiments, the stage 103 is configured to hold the substrate 104. In some embodiments, the substrate 104 is attached to the stage 103. In some embodiments, the stage 103 is rotatable about its center.

In some embodiments, the substrate 104 is disposed on the stage 103. In some embodiments, the substrate 104 is rotatable about its center by the stage 103. In some embodiments, the substrate 104 is a wafer. In some embodiments, the substrate 104 includes a circuitry thereover. In some embodiments, the substrate 104 includes electrical components and conductive lines connecting the electrical components. In some embodiments, the substrate 104 is electrically connected to an anode.

Upon the sputtering operations, the magnetron 101 provides a magnetic field around the target 102, and the magnetic field generated from the magnetron energizes ions (such as argon ions or the like) and guides the energized ions to knock out atoms of the target 102. The atoms of the target 102 are then displaced towards the substrate 104, and as a result the atoms of the target 102 are sputtered over a surface of the substrate 104 to form the coating 102a on the surface of the substrate 104.

Figure 2:
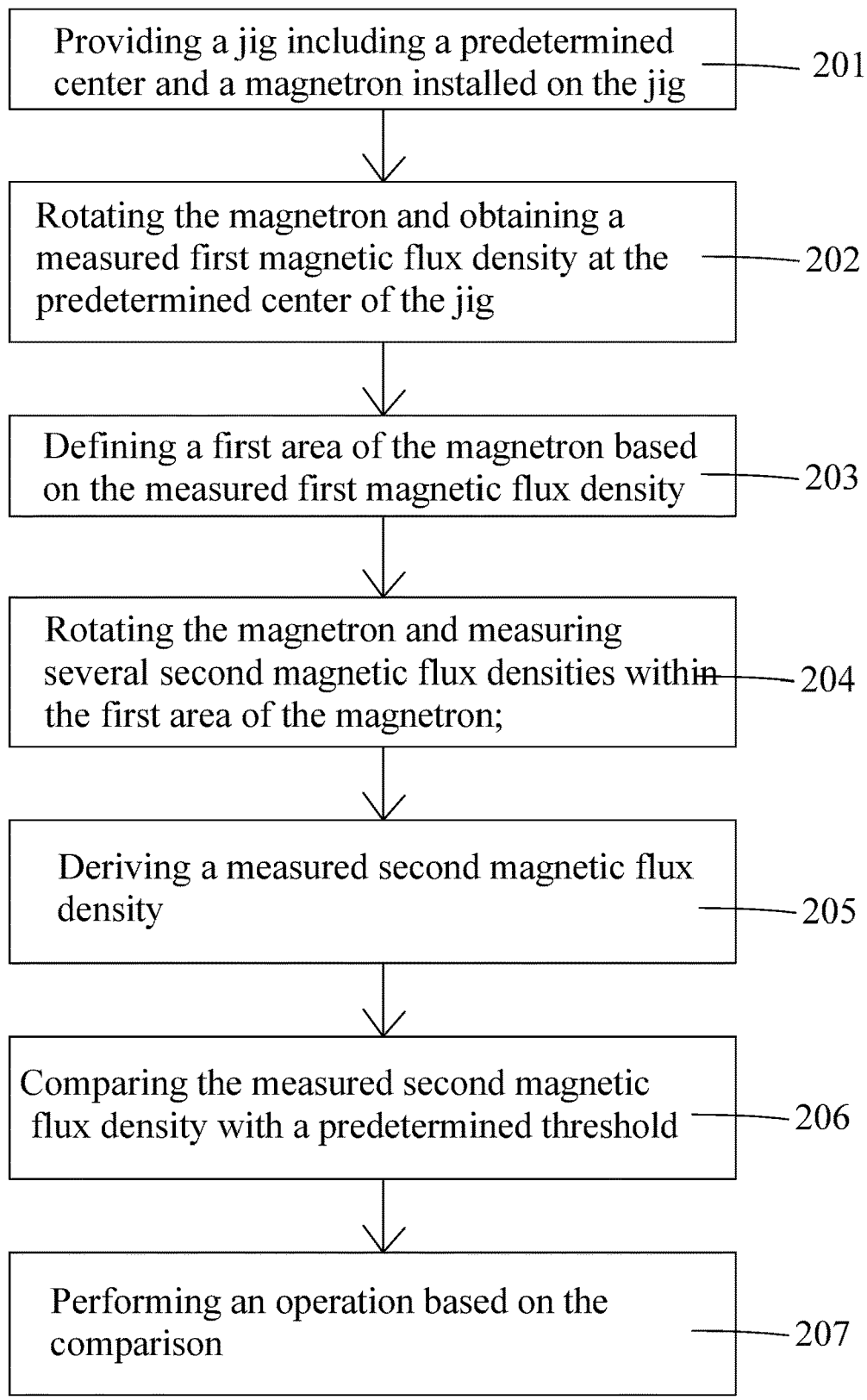
FIG. 2 is a flow diagram of a method of analyzing a manufacturing apparatus in accordance with some embodiments of the present disclosure.

In the present disclosure, a method of analyzing a manufacturing apparatus is disclosed. In some embodiments, a component of the manufacturing apparatus is analyzed by a method 200. The method 200 includes a number of operations and the description and illustration are not deemed as a limitation as the sequence of the operations. FIG. 2 is an embodiment of the method 200 of analyzing the component of the manufacturing apparatus. The method 200 includes a number of operations (201, 202, 203, 204, 205, 206 and 207). In some embodiments, the method 200 can be automatically performed. In some embodiments, the method 200 is implemented in automation. In some embodiments, all components of the manufacturing apparatus involved in the method 200 are integrated and controlled by programming in order to automatically perform a measurement of a center of the magnetron 101.

Figure 3:
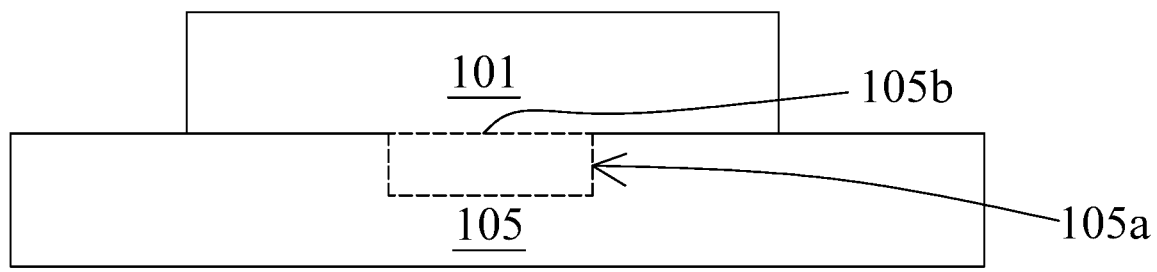
FIGS. 3-4 are schematic cross sectional views of analyzing a manufacturing apparatus by a method of FIG. 2 in accordance with some embodiments of the present disclosure.

In operation 201, a first jig 105 and a magnetron 101 are provided as shown in FIG. 3. In some embodiments, the first jig 105 is configured to hold the magnetron 101. In some embodiments, the first jig 105 includes a first recess 105a for receiving a portion of the magnetron 101, such that the magnetron 101 can be temporarily fixed on the first jig 105.

In some embodiments, the first jig 105 includes a first predetermined center 105b. In some embodiments, the first predetermined center 105b is a rough or estimated center of the first jig 105 and therefore is deviated from an exact center of the first jig 105. In some embodiments, the first predetermined center 105b is substantially equivalent to the exact center of the first jig 105. In some embodiments, a probe is displaced towards the first predetermined center 105b and above the magnetron 101 for subsequent measurement.

Figure 4:
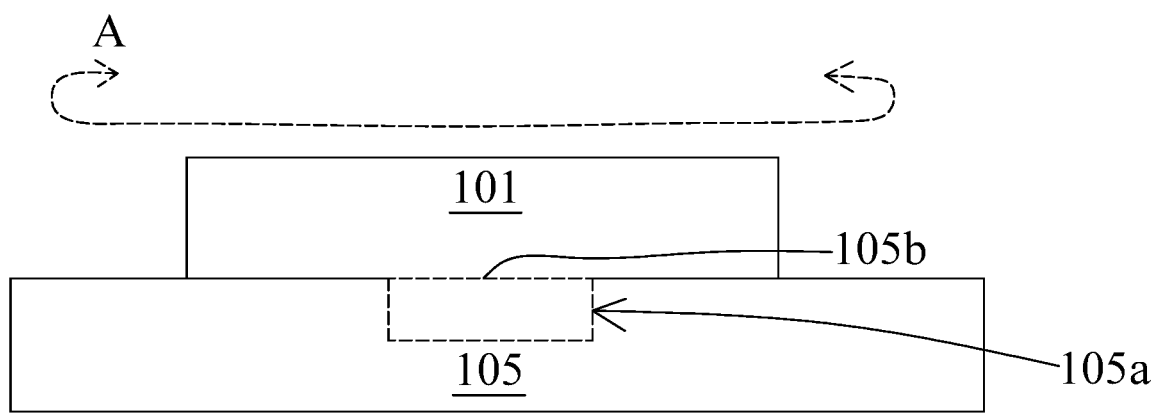

In operation 202, the magnetron 101 is rotated and a measured first magnetic flux density at the first predetermined center 105b of the first jig 105 is obtained. In some embodiments, the magnetron 101 is rotated about the first predetermined center 105b. In some embodiments, the magnetron 101 is rotated as an arrow A shown in FIG. 4. In some embodiments, the first magnetic flux density at the first predetermined center 105b is measured by a probe. In some embodiments, several first magnetic flux densities are measured upon the rotation of the magnetron 101, and a first maximum magnetic flux density and a first minimum magnetic flux density are obtained among the first magnetic flux densities. In some embodiments, the measured first magnetic flux density is a difference between the first maximum magnetic flux density and the first minimum magnetic flux density. In some embodiments, the measured first magnetic flux density is a standard deviation derived from the first magnetic flux densities, the first maximum magnetic flux density and the first minimum magnetic flux density. In some embodiments, the measured first magnetic flux density is recorded.

In operation 203, a first area of the magnetron 101 based on the measured first magnetic flux density is defined. In some embodiments, the first area of the magnetron 101 is defined around the first predetermined center 105b. In some embodiments, the first area of the magnetron 101 is defined by outward expansion from the first predetermined center 105b. In some embodiments, a dimension or size of the first area of the magnetron 101 is based on a magnitude of the measured first magnetic flux density obtained in the operation 202. In some embodiments, the dimension of the first area of the magnetron 101 is substantially proportional to the magnitude of the measured first magnetic flux density. For example, a relatively large area of the magnetron 101 (e.g. 5 cm×5 cm) is defined if a relatively large measured first magnetic flux density (e.g. 50 Gauss or above) is obtained.

In operation 204, the magnetron 101 is rotated and several second magnetic flux densities within the first area of the magnetron 101 are measured. In some embodiments, the magnetron 101 is rotated about the first predetermined center 105b. In some embodiments, the second magnetic flux densities within the first area of the magnetron 101 are measured by a probe. The second magnetic flux densities are obtained by probing several points within the first area of the magnetron 101. In some embodiments, the second magnetic flux densities are recorded.

In operation 205, a measured second magnetic flux density is derived. In some embodiments, several second magnetic flux densities are measured upon the rotation of the magnetron 101, and a second maximum magnetic flux density and a second minimum magnetic flux density are obtained among the second magnetic flux densities. In some embodiments, the measured second magnetic flux density is a difference between the second maximum magnetic flux density and the second minimum magnetic flux density. In some embodiments, the measured second magnetic flux density is a standard deviation derived from the second magnetic flux densities, the second maximum magnetic flux density and the second minimum magnetic flux density. In some embodiments, the measured second magnetic flux density is recorded.

In operation 206, the measured second magnetic flux density is compared with a predetermined threshold. In some embodiments, the predetermined threshold is a magnitude of a magnetic flux density such as zero Gauss, 0.3 Gauss, 1 Gauss, 2 Gauss, 5 Gauss, 10 Gauss, 20 Gauss, etc. In some embodiments, the predetermined threshold can be automatically or manually defined.

In operation 207, an operation is performed based on the comparison (the operation 206). In some embodiments, if the measured second magnetic flux density is equal to or substantially less than the predetermined threshold according to the comparison (the operation 206), a position of the magnetron 101 having the minimum second magnetic flux density is defined as a center of the magnetron 101. For example, if the measured second magnetic flux density is equal to or less than 0.2 Gauss, a position of the magnetron 101 having the minimum second magnetic flux density is defined as a center of the magnetron 101. In some embodiments, the center of the magnetron 101 having the minimum second magnetic flux density is an exact center of the magnetron 101. In some embodiments, the center of the magnetron 101 is vertically aligned with or deviated from the first predetermined center 105b of the jig 105.

In some embodiments, the position of the magnetron 101 defined as the center of the magnetron 101 is derived. In some embodiments, a coordinate of the position of the center of the magnetron 101 is obtained and recorded. In some embodiments, the probe is moved to the position of the center of the magnetron 101 after obtaining the coordinate of the position of the center of the magnetron 101.

In some embodiments, if the measured second magnetic flux density is substantially greater than the predetermined threshold according to the comparison (the operation 206), the operations 203, 204, 205 and 206 are repeated. In some embodiments, after the comparison (the operation 206), a second area of the magnetron 101 based on the measured second magnetic flux density obtained in the operation 205 is defined. In some embodiments, the second area of the magnetron 101 is substantially larger than the first area of the magnetron 101 defined in the operation 203.

In some embodiments, the second area of the magnetron 101 is defined by expanding the first area of the magnetron 101. In some embodiments, a dimension or size of the second area of the magnetron 101 is based on a magnitude of the measured second magnetic flux density. In some embodiments, the dimension of the second area of the magnetron 101 is substantially proportional to the magnitude of the measured second magnetic flux density. In some embodiments, the first area of the magnetron 101 is expanded or shrunken to the second area of the magnetron 101. In some embodiments, the first area of the magnetron 101 is same as the second area of the magnetron 101. For example, if the difference between the measured second magnetic flux density and the predetermined threshold is relatively large (e.g. 50 Gauss or above), expansion of the first area becomes larger (e.g. expanding from the first area with 5 cm×5 cm to the second area with 10 cm×10 cm). For example, if the difference between the measured second magnetic flux density and the predetermined threshold is relatively small (e.g. less than 10 Gauss), expansion of the first area becomes smaller (e.g. expanding from the first area with 5 cm×5 cm to the second area with 7 cm×7 cm). In some embodiments, the definition of the second area of the magnetron 101 is similar to the operation 203.

In some embodiments, after defining the second area of the magnetron 101, the magnetron 101 is rotated and several third magnetic flux densities within the second area of the magnetron 101 are measured. In some embodiments, the magnetron 101 is rotated about the first predetermined center 105b. In some embodiments, the third magnetic flux densities within the second area of the magnetron 101 are measured by a probe. The third magnetic flux densities are obtained by probing several points within the second area of the magnetron 101. In some embodiments, the third magnetic flux densities are recorded. In some embodiments, the measurement of the third magnetic flux densities is similar to the operation 204.

In some embodiments, after the measurement of the third magnetic flux densities, a measured third magnetic flux density is obtained. In some embodiments, several third magnetic flux densities are measured upon the rotation of the magnetron 101, and a third maximum magnetic flux density and a third minimum magnetic flux density are obtained among the third magnetic flux densities. In some embodiments, the measured third magnetic flux density is a difference between the third maximum magnetic flux density and the third minimum magnetic flux density. In some embodiments, the measured third magnetic flux density is a standard deviation derived from the third magnetic flux densities, the third maximum magnetic flux density and the third minimum magnetic flux density. In some embodiments, the deriving of the measured third magnetic flux density is similar to the operation 205. In some embodiments, the measured third magnetic flux density is recorded.

In some embodiments, after deriving the measured third magnetic flux density, the measured third magnetic flux density is compared with the predetermined threshold. In some embodiments, the comparison is similar to the operation 206.

In some embodiments, if the measured third magnetic flux density is equal to or substantially less than the predetermined threshold, a position of the magnetron 101 having the minimum third magnetic flux density is defined as a center of the magnetron 101. In some embodiments, the center of the magnetron 101 having the minimum third magnetic flux density is an exact center of the magnetron 101. In some embodiments, the center of the magnetron 101 is vertically aligned with or deviated from the first predetermined center 105b of the jig 105.

In some embodiments, the position of the magnetron 101 defined as the center of the magnetron 101 is derived. In some embodiments, a coordinate of the position of the center of the magnetron 101 is obtained and recorded. In some embodiments, the probe is moved to the position of the center of the magnetron 101 after obtaining the coordinate of the position of the center of the magnetron 101.

In some embodiments, if the measured third magnetic flux density is substantially greater than the predetermined threshold, the operations 203, 204, 205 and 206 are repeated again. The operations are terminated when an exact center of the magnetron 101 was found.

Figure 5:
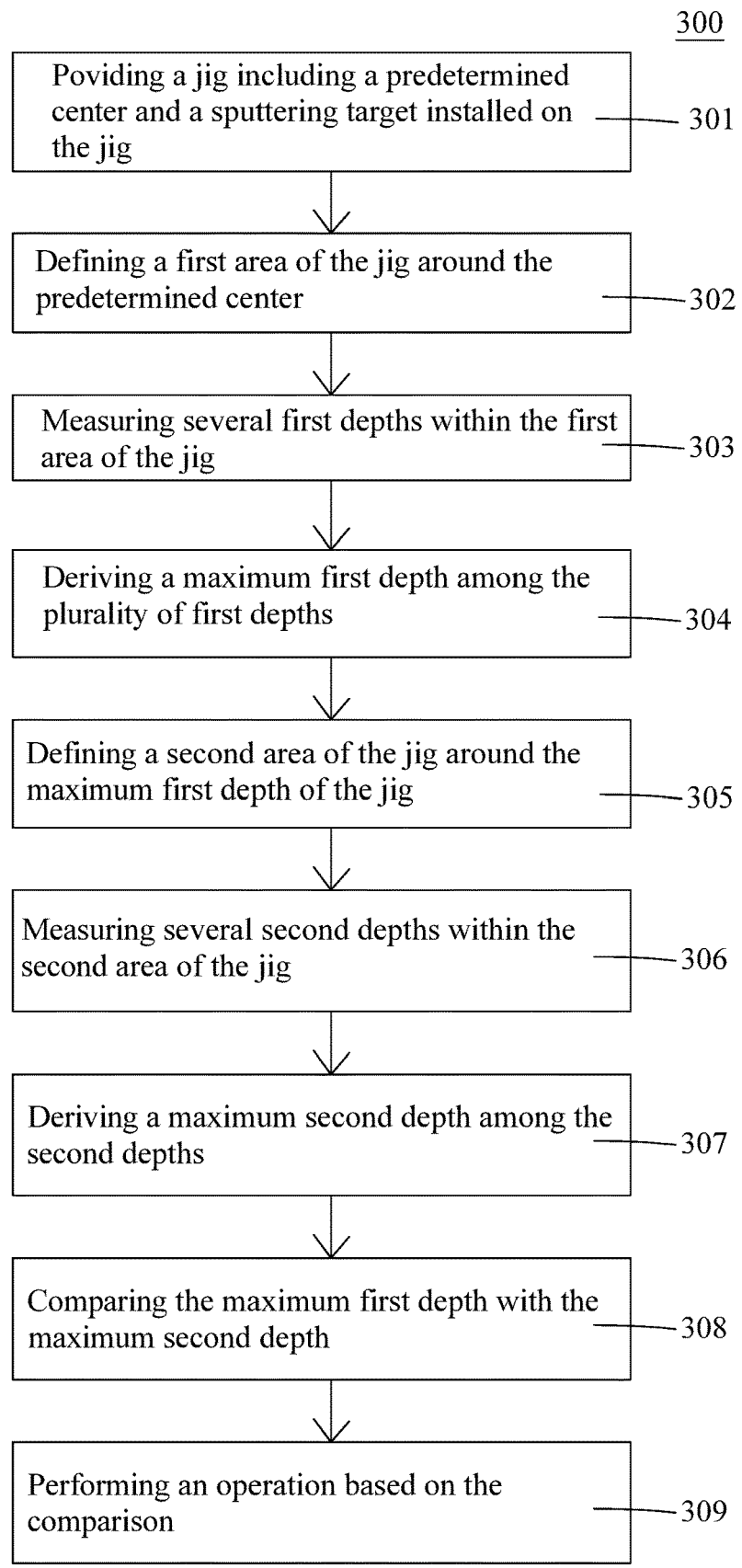
FIG. 5 is a flow diagram of a method of analyzing a manufacturing apparatus in accordance with some embodiments of the present disclosure.

In the present disclosure, a method of analyzing a manufacturing apparatus is disclosed. In some embodiments, a component of the manufacturing apparatus is analyzed by a method 300. The method 300 includes a number of operations and the description and illustration are not deemed as a limitation as the sequence of the operations. FIG. 5 is an embodiment of the method 300 of analyzing the component of the manufacturing apparatus. The method 300 includes a number of operations (301, 302, 303, 304, 305, 306, 307, 308 and 309). In some embodiments, the method 300 can be automatically performed. In some embodiments, the method 300 is implemented in automation. In some embodiments, all components of the manufacturing apparatus involved in the method 300 are integrated and controlled by programming in order to automatically perform a measurement of a center of the sputtering target 102.

Figure 6:
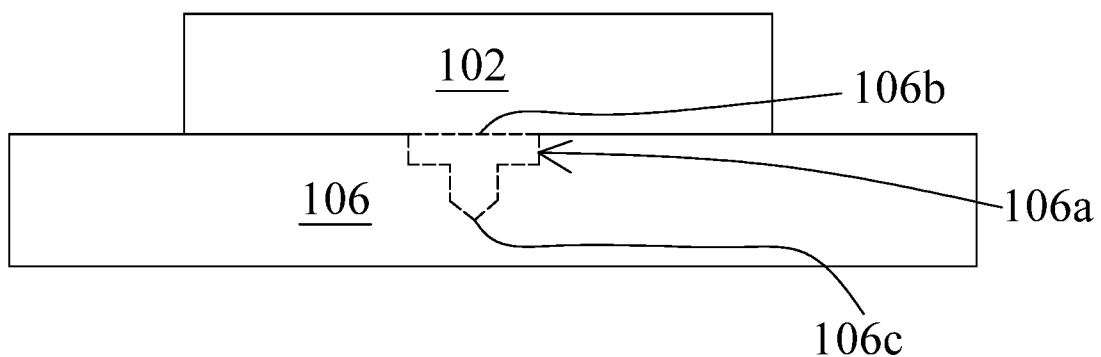
FIG. 6 is a schematic cross sectional view of analyzing a manufacturing apparatus by a method of FIG. 5 in accordance with some embodiments of the present disclosure.

In operation 301, a second jig 106 and a sputtering target 102 are provided as shown in FIG. 6. In some embodiments, the second jig 106 is configured to hold the sputtering target 102. In some embodiments, the second jig 106 includes a second recess 106a for receiving a portion of the sputtering target 102, such that the sputtering target can be temporarily fixed on the second jig 106.

In some embodiments, the second jig 106 includes a second predetermined center 106b. In some embodiments, the second predetermined center 106b is a rough center of the second jig 106 and therefore is deviated from an exact center of the second jig 106. In some embodiments, the second predetermined center 106b is substantially equivalent to the exact center of the second jig 106. In some embodiments, a probe is displaced towards the second predetermined center 106b for subsequent measurement.

In operation 302, a first area of the second jig 106 is defined. In some embodiments, the first area of the second jig 106 is defined around the second predetermined center 106b. In some embodiments, the first area of the second jig 106 is defined by outward expansion from the second predetermined center 106b.

In operation 303, several first depths within the first area of the second jig 106 are measured. In some embodiments, the first depths are measured by a probe. The first depths are obtained by probing several points within the first area of the second jig 106. In some embodiments, the first depths are recorded.

In operation 304, a maximum first depth among the first depths is derived. In some embodiments, the maximum first depth is determined after the measurement of the first depths. In some embodiments, a position of the second jig 106 having the maximum first depth is also derived. In some embodiments, the maximum first depth is recorded.

In operation 305, a second area of the second jig 106 is defined. In some embodiments, the second area of the second jig 106 is defined around the maximum first depth of the second jig 106. In some embodiments, the first area of the second jig 106 is substantially greater than, smaller than or equal to the second area of the second jig 106. In some embodiments, the second area of the jig 106 is defined by contracting the first area of the second jig 106. In some embodiments, the first area and the second area of the second jig 106 are at least partially overlapped with each other. In some embodiments, expansion or shrinkage of the first area to the second area is based on a magnitude of the maximum first depth.

In operation 306, several second depths within the second area of the second jig 106 are measured. In some embodiments, the second depths are measured by a probe. The second depths are obtained by probing several points within the second area of the second jig 106. In some embodiments, the second depths are recorded.

In operation 307, a maximum second depth among the second depths is derived. In some embodiments, the maximum second depth is determined after the measurement of the second depths. In some embodiments, a position of the second jig 106 having the maximum second depth is also derived. In some embodiments, the maximum second depth is recorded.

In operation 308, the maximum first depth is compared with the maximum second depth. In some embodiments, the comparison can determine if a maximum depth of the second jig 106 was found.

In operation 309, an operation is performed based on the comparison (the operation 308). In some embodiments, if the maximum first depth is substantially greater than the maximum second depth according to the comparison (the operation 308), a position of the second jig 106 having the maximum first depth is defined as a center 106c of the second jig 106. In some embodiments, the center 106c of the second jig 106 having the maximum first depth is an exact center of the second jig 106.

In some embodiments, a center of the sputtering target 102 can be determined based on the center 106c of the second jig 106 having the maximum first depth. The center of the sputtering target 102 is vertically aligned with the center 106c of the second jig 106. In some embodiments, a position of the second jig 106 having the maximum first depth is recorded. In some embodiments, a coordinate of the position of the second jig 106 is obtained and recorded. In some embodiments, a position of the center of the sputtering target 102 is vertically aligned with the position of the second jig 106. In some embodiments, a coordinate of the position of the center of the sputtering target 102 is obtained and recorded.

In some embodiments, if the maximum first depth is substantially less than the maximum second depth according to the comparison (the operation 308), the operations 305, 306, 307 and 308 are repeated. In some embodiments, after the comparison (the operation 308), a third area of the second jig 106 is defined. In some embodiments, the third area of the second jig 106 is defined around the maximum second depth of the second jig 106. In some embodiments, the first area of the second jig 106 and the second area of the second jig 106 are substantially the same as each other. In some embodiments, the second area of the second jig 106 is substantially larger than the first area of the second jig 106. In some embodiments, the definition of the third area of the second jig 106 is similar to the operation 305.

In some embodiments, after defining the third area of the second jig 106, several third depths within the third area of the second jig 106 are measured. In some embodiments, the third depths are measured by a probe. The third depths are obtained by probing several points within the third area of the second jig 106. In some embodiments, the third depths are recorded. In some embodiments, the measurement of the third depths is similar to the operation 306.

In some embodiments, after the measurement of the third depths, a maximum third depth among the third depths is derived. In some embodiments, the maximum third depth is determined after the measurement of the third depths. In some embodiments, a position of the second jig 106 having the maximum third depth is also derived. In some embodiments, the maximum third depth is recorded. In some embodiments, the deriving of the maximum third depth is similar to the operation 307.

In some embodiments, after deriving the maximum third depth, the maximum third depth is compared with the maximum second depth. In some embodiments, the comparison can determine if a maximum depth of the second jig 106 was found. In some embodiments, the comparison is similar to the operation 308.

In some embodiments, if the maximum third depth is substantially less than the maximum second depth according to the comparison, a position of the second jig 106 having the maximum second depth is defined as a center 106c of the second jig 106. In some embodiments, the center 106c of the second jig 106 having the maximum second depth is an exact center of the second jig 106.

In some embodiments, a center of the sputtering target 102 can be determined based on the center 106c of the second jig 106 having the maximum second depth. The center of the sputtering target 102 is vertically aligned with the center 106c of the second jig 106. In some embodiments, a position of the second jig 106 having the maximum second depth is recorded. In some embodiments, a coordinate of the position of the second jig 106 is obtained and recorded. In some embodiments, a position of the center of the sputtering target 102 is vertically aligned with the position of the second jig 106. In some embodiments, a coordinate of the position of the center of the sputtering target 102 is obtained and recorded.

In some embodiments, if the maximum third depth is substantially greater than the maximum second depth according to the comparison, the operations 305, 306, 307 and 308 are repeated again. In some embodiments, the operations are terminated if a maximum depth of the second jig 106 was found.

In some embodiments, a method includes providing a jig including a predetermined center and a magnetron installed on the jig; rotating the magnetron and obtaining a measured first magnetic flux density at the predetermined center of the jig; defining a first area of the magnetron based on the measured first magnetic flux density; rotating the magnetron and measuring a plurality of second magnetic flux densities within the first area of the magnetron; deriving a measured second magnetic flux density among the plurality of second magnetic flux densities; comparing the measured second magnetic flux density with a predetermined threshold; and performing an operation based on the comparison.

In some embodiments, the performance of the operation includes defining a center of the magnetron having the minimum second magnetic flux density; deriving a position of the center of the magnetron; moving a probe to the position of the center of the magnetron. In some embodiments, the measured second magnetic flux density is equal to or substantially less than the predetermined threshold. In some embodiments, the center of the magnetron is vertically aligned with or deviated from the predetermined center of the jig. In some embodiments, a dimension of the first area of the magnetron is substantially proportional to a magnitude of the measured first magnetic flux density.

In some embodiments, the performance of the operation includes defining a second area of the magnetron based on the measured second magnetic flux density; rotating the magnetron and measuring a plurality of third magnetic flux densities within the second area of the magnetron; deriving a measured third magnetic flux density among the plurality of third magnetic flux densities; comparing the measured third magnetic flux density with the predetermined threshold. In some embodiments, the performance of the operation further includes defining a center of the magnetron having the minimum third magnetic flux density; deriving a position of the center of the magnetron; moving a probe to the position of the center of the magnetron.

In some embodiments, the measured third magnetic flux density is equal to or substantially less than the predetermined threshold. In some embodiments, the center of the magnetron is vertically aligned with or deviated from the predetermined center of the jig. In some embodiments, a dimension of the second area of the magnetron is substantially proportional to a magnitude of the measured second magnetic flux density. In some embodiments, the second area of the magnetron is substantially larger than, smaller than or equal to the first area of the magnetron.

In some embodiments, a method includes providing a jig including a predetermined center and a sputtering target installed on the jig; defining a first area of the jig around the predetermined center, measuring a plurality of first depths within the first area of the jig; deriving a maximum first depth among the plurality of first depths; defining a second area of the jig around the maximum first depth of the jig; measuring a plurality of second depths within the second area of the jig; deriving a maximum second depth among the plurality of second depths; comparing the maximum first depth with the maximum second depth; and performing an operation based on the comparison.

In some embodiments, the first area of the jig is substantially greater than the second area of the jig. In some embodiments, the maximum first depth is substantially greater than the maximum second depth. In some embodiments, the performance of the operation includes recording a position of the jig having the maximum first depth; defining a center of the sputtering target vertically aligned with the position of the jig having the maximum first depth. In some embodiments, the maximum first depth is substantially less than the maximum second depth.

In some embodiments, the performance of the operation includes defining a third area of the jig around the maximum second depth of the jig; measuring a plurality of third depths within the third area of the jig; deriving a maximum third depth among the plurality of third depths; comparing the maximum third depth with the maximum second depth; recording a position of the jig having the maximum second depth; defining a center of the sputtering target vertically aligned with the position of the jig having the maximum second depth. In some embodiments, the maximum third depth is substantially less than the maximum second depth.

In some embodiments, a method includes providing a magnetron having an estimated center, rotating the magnetron and obtaining a measured first magnetic flux density at the estimated center; defining an area of the magnetron around the estimated center, rotating the magnetron and measuring a plurality of second magnetic flux densities within the area of the magnetron; deriving a measured second magnetic flux density among the plurality of second magnetic flux densities; comparing the measured second magnetic flux density with a predetermined threshold; and defining a center of the magnetron based on the comparison.

In some embodiments, the method further includes expanding the area of the magnetron; rotating the magnetron and measuring a plurality of third magnetic flux densities within the expanded area of the magnetron; deriving a measured third magnetic flux density among the plurality of third magnetic flux densities; comparing the measured third magnetic flux density with the predetermined threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a jig having a recess and a predetermined center within the recess;
   defining a first area of the jig around the predetermined center by outward expansion from the predetermined center in a first distance;
   measuring a plurality of first depths of the jig within the first area of the jig by a probe;
   deriving a maximum first depth among the plurality of first depths;
   defining a second area of the jig around a first position of the jig having the maximum first depth of the jig by outward expansion from the first position in a second distance;
   measuring a plurality of second depths of the jig within the second area of the jig by the probe;
   deriving a maximum second depth among the plurality of second depths;
   comparing the maximum second depth with the maximum first depth; and
   performing an operation if the maximum first depth is substantially greater than or equal to the maximum second depth, wherein the operation includes defining the first position of the jig having the maximum first depth of the jig as an exact center of the jig.

2. The method of claim 1, wherein the predetermined center is deviated from the exact center of the jig.

3. The method of claim 1, wherein the second area of the jig is substantially greater than, less than or equal to the first area of the jig.

4. The method of claim 1, wherein the second distance is substantially greater than, less than or equal to the first distance.

5. The method of claim 1, wherein the operation includes recording the first position of the jig having the maximum first depth of the jig.

6. The method of claim 1, wherein the operation includes installing a sputtering target on the jig.

7. The method of claim 6, wherein a center of the sputtering target is vertically aligned with the exact center of the jig.

8. The method of claim 1, wherein the first area of the jig and the second area of the jig are disposed within the recess.

9. The method of claim 1, wherein the first position of the jig is disposed within the recess.

10. A method, comprising:
    providing a jig having a recess and a predetermined center within the recess;
    defining a first area of the jig around the predetermined center by outward expansion from the predetermined center in a first distance;
    measuring a plurality of first depths of the jig within the first area of the jig by a probe;
    deriving a maximum first depth among the plurality of first depths;
    defining a second area of the jig around a first position of the jig having the maximum first depth of the jig by outward expansion from the first position in a second distance;
    measuring a plurality of second depths of the jig within the second area of the jig by the probe;
    deriving a maximum second depth among the plurality of second depths;
    comparing the maximum second depth with the maximum first depth; and
    performing an operation if the maximum first depth is substantially less than the maximum second depth, wherein the operation includes defining a third area of the jig around a second position of the jig having the maximum second depth of the jig by outward expansion from the second position in a third distance.

11. The method of claim 10, wherein the third distance is proportional to a difference between the maximum second depth and the maximum first depth.

12. The method of claim 10, wherein the operation includes:
    measuring a plurality of third depths of the jig within the third area of the jig by the probe;
    deriving a maximum third depth among the plurality of third depths;
    comparing the maximum third depth with the maximum second depth.

13. The method of claim 12, further comprising defining the second position of the jig having the maximum second depth of the jig as an exact center of the jig, if the maximum second depth is substantially greater than or equal to the maximum third depth.

14. The method of claim 13, further comprising installing a sputtering target on the jig.

15. The method of claim 14, wherein a center of the sputtering target is vertically aligned with the exact center of the jig.

16. The method of claim 12, further comprising, if the maximum second depth is substantially less than the maximum third depth:
- measuring a plurality of fourth depths of the jig within the fourth area of the jig by the probe;
- deriving a maximum fourth depth among the plurality of fourth depths;
- comparing the maximum fourth depth with the maximum third depth.

17. The method of claim 16, further comprising defining the third position of the jig having the maximum third depth of the jig as an exact center of the jig, if the maximum third depth is substantially greater than or equal to the maximum fourth depth.

18. The method of claim 16, further comprising, if the maximum third depth is substantially less than the maximum fourth depth:
- measuring a plurality of fifth depths of the jig within the fifth area of the jig by the probe;
- deriving a maximum fifth depth among the plurality of fifth depths;
- comparing the maximum fifth depth with the maximum fourth depth.

19. A method, comprising:
- providing a jig having a recess and a predetermined center within the recess;
- defining an area of the jig around the predetermined center by outward expansion from the predetermined center in a distance;
- measuring a plurality of depths of the jig within the area of the jig by a probe;
- deriving a maximum depth among the plurality of depths;
- defining a position of the jig having the maximum depth of the jig as an exact center of the jig;
- vertically aligning a center of a sputtering target with the position of the jig; and
- installing the sputtering target on the jig after the vertical alignment.

20. The method of claim 19, wherein the predetermined center is derived from or substantially equivalent to the position of the jig.

* * * * *